United States Patent
Lin et al.

(10) Patent No.: US 6,524,910 B1
(45) Date of Patent: Feb. 25, 2003

(54) METHOD OF FORMING DUAL THICKNESS GATE DIELECTRIC STRUCTURES VIA USE OF SILICON NITRIDE LAYERS

(75) Inventors: Wenhe Lin, Singapore (SG); Kin Leong Pey, Singapore (SG); Mei Sheng Zhou, Singapore (SG); Zhong Dong, Singapore (SG); Simon Chooi, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 09/670,329

(22) Filed: Sep. 27, 2000

(51) Int. Cl.⁷ .............................................. H01L 21/336
(52) U.S. Cl. ..................... 438/257; 438/587; 438/588
(58) Field of Search ................. 438/157, 199, 438/218, 219, 231, 257, 301, 591, 587, 588, 981

(56) References Cited

U.S. PATENT DOCUMENTS

| | | | |
|---|---|---|---|
| 5,861,347 A | 1/1999 | Maiti et al. | 438/787 |
| 5,918,133 A | 6/1999 | Gardner et al. | 438/299 |
| 5,960,289 A | 9/1999 | Tsui et al. | 438/275 |
| 6,048,769 A | 4/2000 | Chau | 438/275 |
| 6,087,236 A * | 7/2000 | Chau et al. | 438/301 |

* cited by examiner

Primary Examiner—David Nelms
Assistant Examiner—Dung A Le
(74) Attorney, Agent, or Firm—George O. Saile; Rosemary L. S. Pike

(57) ABSTRACT

A process for forming a first group of gate structures, designed to operate at a lower voltage than a simultaneously formed second group of gate structures, has been developed. The process features the thermal growth of a first silicon dioxide gate insulator layer, on a portion of the semiconductor substrate used for the lower voltage gate structures, while simultaneously forming a thicker, second silicon dioxide gate insulator layer on a portion of the semiconductor substrate used for the higher voltage gate structures. The thermal growth of the first, and second silicon dioxide gate insulator layers is accomplished via diffusion of the oxidizing species: through a thick, composite silicon nitride layer, to obtain the thinner, first silicon dioxide gate insulator layer, on a first portion of the semiconductor substrate; and through a thinner, silicon nitride layer, to obtain the thicker, second silicon dioxide gate insulator layer, on a second portion of the semiconductor substrate.

14 Claims, 2 Drawing Sheets

METHOD OF FORMING DUAL THICKNESS GATE DIELECTRIC STRUCTURES VIA USE OF SILICON NITRIDE LAYERS

BACKGROUND OF THE INVENTION (1) Field of the Invention

The present invention relates to methods used to fabricate semiconductor devices, and more specifically to a method used to create dual gate dielectric structures, featuring different thicknesses for the silicon oxide component of each gate dielectric structure.

(2) Description of Prior Art

The increasing integrated circuit applications featuring dual voltage capabilities, necessitate the need for a specific gate insulator thickness to satisfy each specific voltage of the circuit requirement. Therefore procedures for fabricating a silicon dioxide gate insulator layer, at a specific thickness for specific regions of a semiconductor chip, while fabricating another silicon dioxide gate insulator layer, at a different thickness, for a different region of the same semiconductor chip, is needed. One such procedure is to thermally grow a thick silicon dioxide layer on the entire semiconductor substrate followed by a patterning procedure employed to remove the thick silicon oxide layer in regions in which a subsequent thinner silicon dioxide gate insulator will be thermally grown. This procedure however places masking photoresist shapes on the surface of the portion of the thick silicon oxide layer, which will be used as the gate insulator layer for the higher voltage applications. The contamination presented by the photoresist shapes, and the possible photoresist residue remaining on the gate insulator layer after photoresist removal procedures, can deleteriously influence the integrity of the thick silicon dioxide gate insulator component of the gate structure in terms of yield and reliability.

The present invention will describe a procedure for creation of both thick and thin, silicon dioxide gate insulator layers, on the same semiconductor substrate, however without directly subjecting any portion of an existing silicon dioxide layer, to photoresist processing. This is accomplished via thermal oxidation of an underlying semiconductor substrate, through portions of overlying thin silicon nitride shapes, and through portions of overlying thick silicon nitride shapes. Prior art, such as Tsui et al, in U.S. Pat. No. 5,960,289, describe the attainment of dual gate insulator layers via thermal oxidation of a portion of bare semiconductor, resulting in a first silicon dioxide layer, while a second silicon dioxide layer is protected by a silicon nitride shape, during the oxidation procedure. This prior art however subjects the portion of the semiconductor substrate to photoresist removal procedures, prior to growth of the first silicon dioxide layer.

SUMMARY OF THE INVENTION

It is an object of this invention to form gate structures, with two different thickness of a silicon dioxide component of the gate structure, with the silicon dioxide components underlying silicon nitride components, in turn comprised with two different thickness.

It is another object of this invention to define a first silicon nitride layer on a first portion of a semiconductor substrate, followed by the deposition of a second silicon nitride layer, resulting in a composite, thick silicon nitride layer, comprised of the second, and first silicon nitride layers, overlying the first portion of the semiconductor substrate, while the thinner, second silicon nitride layer is located overlying a second portion of the semiconductor substrate.

It is still yet another object of this invention to thermally grow a thin silicon dioxide layer, through the composite silicon nitride layer, on the first portion of the semiconductor substrate, while thermally growing a thicker, second silicon dioxide layer, through the second silicon nitride layer, on the second portion of semiconductor substrate.

In accordance with the present invention a method of forming a first group of gate structures, featuring a first silicon dioxide gate insulator layer, while forming a second group of gate structures, featuring a second silicon dioxide gate insulator layer, with the thickness of the second silicon dioxide layer greater than the thickness of the first silicon dioxide gate insulator layer, is described. After deposition of a first silicon nitride layer, on a semiconductor substrate, a portion of the first silicon nitride layer is removed from the surface of a second portion of the semiconductor substrate. A second silicon nitride layer is then deposited resulting in a composite silicon nitride layer overlying a first portion of the semiconductor substrate, with the composite silicon nitride layer comprised of the second silicon nitride layer overlying the first silicon nitride layer. The second portion of the semiconductor substrate is only covered by the second silicon nitride layer. A thermal oxidation procedure next results in the growth of a thinner, first silicon dioxide layer, on the first portion of the semiconductor substrate with the oxidation rate slowed by the overlying composite silicon nitride layer. The same thermal oxidation procedure results in a thicker, second silicon dioxide layer, on the second portion of the semiconductor substrate, featuring a faster oxidation rate though the thinner, second silicon nitride layer. Deposition and patterning of a polysilicon, or polycide layer, results in: a first group of gate structures, located on the first portion of the semiconductor substrate, featuring a gate dielectric comprised of the composite silicon nitride layer on the thin, first silicon dioxide layer; and a second group of gate structures, located on the second portion of the semiconductor substrate, featuring a gate dielectric comprised of the second silicon nitride layer on the thicker, second silicon dioxide layer.

BRIEF DESCRIPTION OF THE DRAWINGS

The object and other advantages of this invention are best described in the preferred embodiments with reference to the attached drawings that include.

DESCRIPTION OF THE PREFERRED EMBODIMENTS

Figure 1:
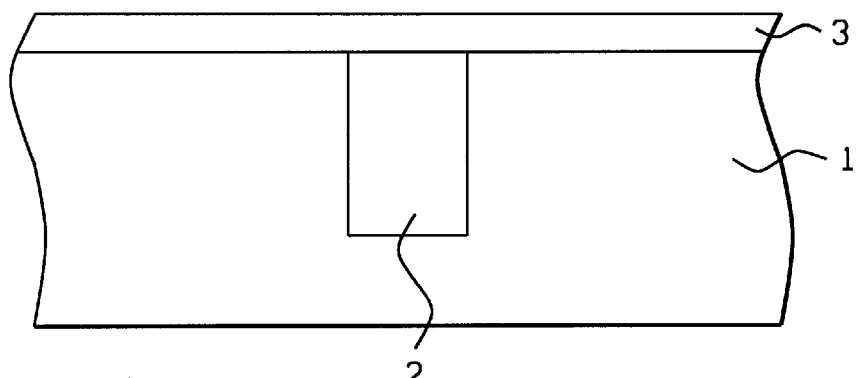
FIGS. 1–6, which schematically in cross-sectional style, describe key stages for the fabrication of a first group of gate structures, comprised with a first silicon dioxide gate insulator layer, and for the simultaneous fabrication of a second group of gate structures, comprised with a second silicon dioxide gate insulator layer, greater in thickness than the first silicon dioxide layer.

The method of forming gate structures, with a first group comprised with a first silicon dioxide gate insulator layer, and with a second group comprised with a thinner, second silicon dioxide gate insulator layer, will now be described in detail. A P type, semiconductor substrate 1, comprised of single crystalline silicon, with a <100> crystallographic orientation, is used and schematically shown in FIG. 1. Isolation region 2, either a thermally grown, field oxide region, (FOX), or a silicon oxide filled, shallow trench isolation, (STI), region, is next formed in semiconductor substrate 1, to isolate subsequent groups of complimentary metal oxide semiconductor, (CMOS), devices, which in turn are comprised of groups of gate structures, or word lines, overlying the silicon dioxide gate insulator layers. A first silicon nitride layer 3, is then deposited to a thickness between about 5 to 30 Angstroms, using a deposition mode chosen from a group that includes; low pressure chemical vapor deposition (LPCVD), rapid thermal chemical vapor deposition (RTCVD), remote plasma enhanced chemical vapor deposition (RPECVD), or jet vapor deposition (JVD), on underlying semiconductor substrate 1. This is schematically shown in FIG. 1.

Figure 2:
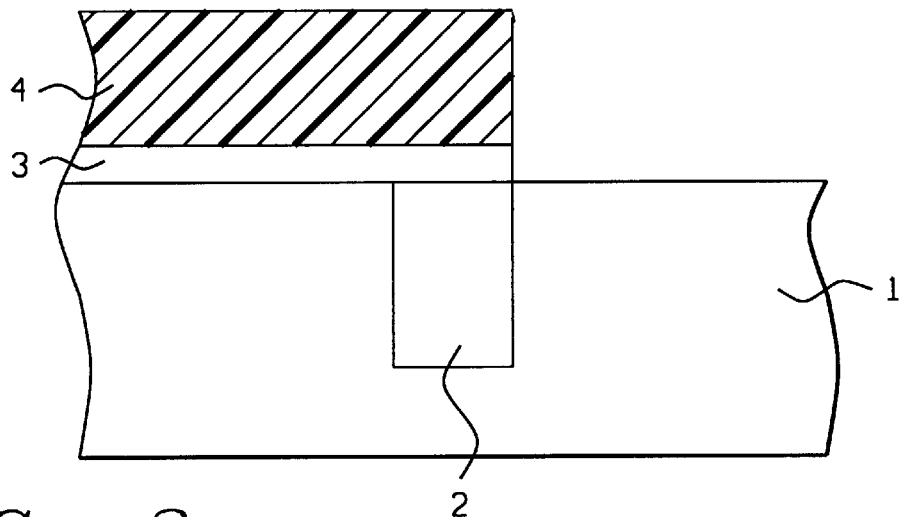

Photoresist shape 4, is next formed to protect the portion of first silicon nitride layer 3, overlying a first portion of semiconductor substrate 1, from the procedure used to selectively remove the portion of silicon nitride layer 3, overlying a second portion of semiconductor substrate 1. This is accomplished via a selective, reactive ion etching procedure, using $CH_2F_2$ as an etchant, with the etch rate ratio of silicon nitride to silicon between about 100 to 1, allowing the silicon nitride removal procedure to slow, or terminate at the appearance of silicon, or semiconductor substrate 1. The result of this procedure is schematically shown in FIG. 2.

Figure 3:
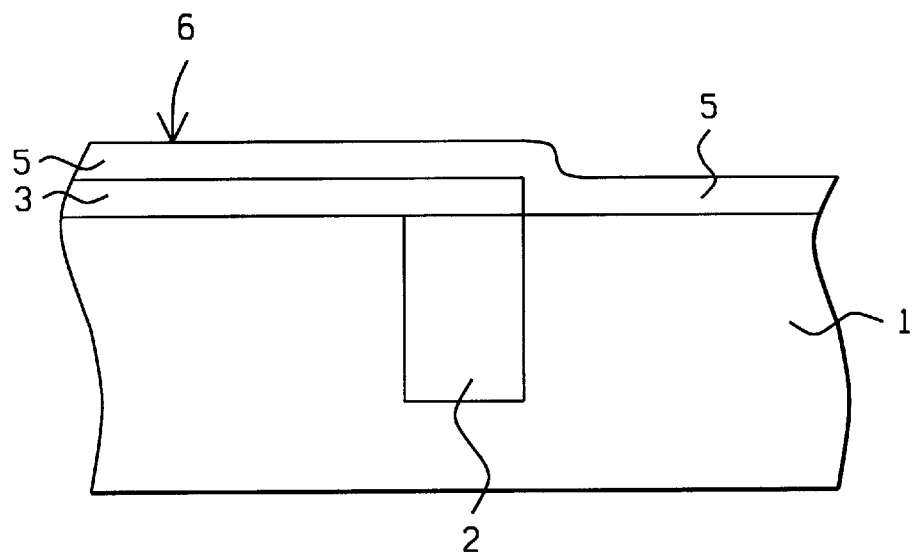

After removal of photoresist shape 4, via plasma oxygen ashing and careful wet cleans, an inorganic wet clean procedure, including a buffered hydrofluoric acid step, is employed to clean the exposed surface of, and to remove any silicon oxide formed on the exposed surface of, semiconductor substrate 1, during the photoresist stripping procedure. A second silicon nitride layer 5, is then deposited, again at a thickness between about 5 to 30 Angstroms, and again via use of a deposition procedure chosen from a group that includes; LPCVD, RPECVD, RTCVD, or JVD. This is schematically shown in FIG. 3. The second silicon nitride deposition results in composite silicon nitride layer 6, comprised of second silicon nitride layer 5, on first silicon nitride layer 3, located overlying a first portion of semiconductor substrate 1, and in a thinner, second silicon layer 5, located overlying a second portion of semiconductor substrate 1.

Figure 4:
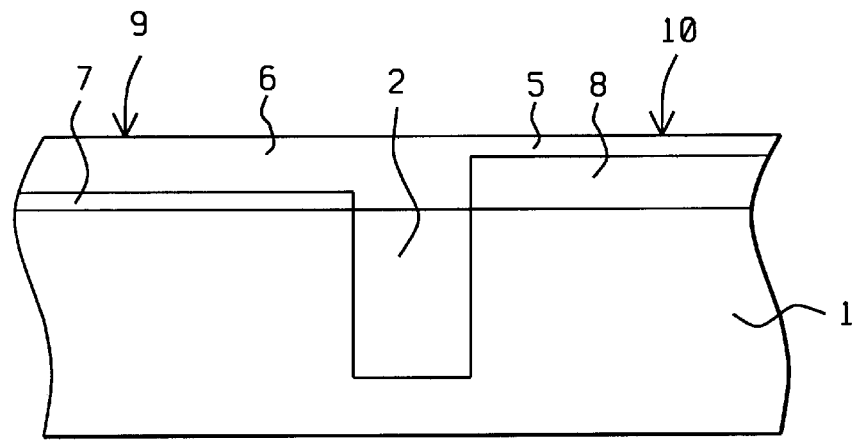

An oxidation procedure is next performed at a temperature between about 800 to 1100° C., for a time between about 10 to 100 sec., in either a conventional furnace, or in a rapid thermal processing, (RTP), system, using an ambient chosen from a group that includes; $N_2O$, $NO_2$, $H_2O_2$, $H_2O$, or $O_2$. The growth of silicon dioxide, on the underlying semiconductor substrate, is greatly influenced by the thickness of the overlying silicon nitride layer. The oxidizing species more readily diffuses though thinner silicon nitride layer 5, than through thicker, composite silicon nitride layer 6. Therefore the result of the oxidation procedure is the growth of thinner, first silicon dioxide layer 7, at a thickness between about 3 to 10 Angstroms, on a first portion of semiconductor substrate 1, underlying composite silicon nitride layer 6, while a thicker, second silicon dioxide layer 8, at a thickness between about 5 to 20 Angstroms, results on a second portion of semiconductor substrate 1, underlying second silicon nitride layer 5. This is schematically shown in FIG. 4. In this embodiment gate insulator layer 9, is then comprised of composite nitride layer 6 and underlying oxide layer 7, while gate insulator layer 10, is comprised of silicon nitride layer 5, and underlying oxide layer 8. In another embodiment silicon nitride layer 5, and silicon nitride layer 6, can be selectively removed using $H_3PO_4$. This the remaining insulator layer is silicon oxide layer 7, and silicon oxide layer 8. In this embodiment an anneal in $N_2O$, $O_2$, or $N_2$ is performed after silicon nitride removal.

Figure 5:
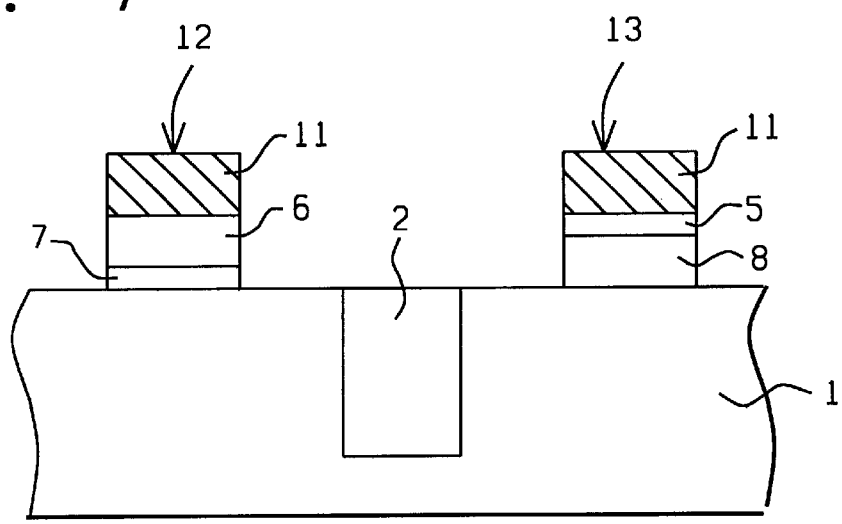
Figure 6:
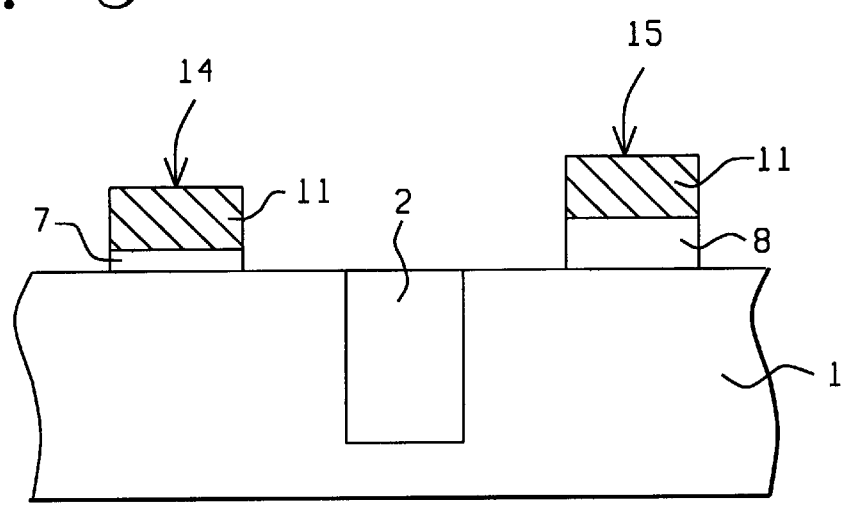

The ability to now define gate structure 12, featuring gate insulator 9, and gate structure 13, featuring gate insulator layer 10, is next addressed and schematically shown in FIG. 5. In another embodiment the process to define gate structure 14, featuring only thin silicon dioxide layer 7, and gate structure 15, featuring only thicker silicon dioxide layer 8, is addressed, and schematically shown in FIG. 6. To define gate structures 12, and 13, the silicon nitride layers remain, while the attainment of gate structures 14, and 15, necessitate the selective removal of silicon nitride layer 6, and silicon nitride layer 5, from silicon oxide layer 7, and from silicon oxide layer 8, respectfully, via use of a hot phosphoric acid solution. A polysilicon layer 11, is next deposited via LPCVD procedures, to a thickness between about 1500 to 3000 Angstroms. Polysilicon layer 11, can either be doped in situ, during deposition via the addition of arsine, or phosphine, to a silane ambient, or polysilicon layer 11, can be deposited intrinsically then doped via implantation or arsenic or phosphorous ions. In addition if lower word line resistance is desired polysilicon layer 11, can be replaced with a metal silicide layer such as tungsten silicide, which can also be obtained via LPCVD procedures. Photoresist shapes, (not shown in the drawings), are next used as an etch mask to allow an anisotropic RIE procedure to define gate structure 12, and gate structure 13, for the embodiment shown in FIG. 5, using $Cl_2$ or $SF_6$ as an etchant for both polysilicon and silicon nitride, while $CHF_3$ is used as an etchant for silicon oxide. Definition of gate structures 14 and 15, for the embodiment shown in FIG. 6, is again accomplished using a photoresist shape as an etch mask for an anisotropic RIE procedure, featuring the use of $Cl_2$ or $SF_6$ as an etchant for polysilicon and $CHF_3$ as an etchant for silicon dioxide. Removal of the masking photoresist shapes is again accomplished via plasma oxygen ashing and careful wet cleans. Therefore gate structure 12, featuring thin gate insulator layer 9, will operate at a lower voltage than gate structure 13, featuring thicker composite gate insulator layer 10.

While this invention has been particularly shown and described with reference to, the preferred embodiments thereof, it will be understood by those skilled in the art that various changes in form and details may be made without departing from the spirit and scope of this invention.

What is claimed is:

1. A method of fabricating groups of gate structures on a semiconductor substrate, featuring a first group of gate structures comprised with a first silicon dioxide gate insulator layer, and featuring a second group of gate structures comprised with a second silicon dioxide gate insulator layer, with said first silicon dioxide gate insulator layer thinner than said second silicon dioxide gate insulator layer, comprising the steps of:

forming a composite silicon nitride layer, on a first portion of said semiconductor substrate, with said composite silicon nitride layer comprised of a first silicon nitride layer, underlying a second silicon nitride layer, while a second portion of said semiconductor substrate is covered by said second silicon nitride layer;

performing an oxidation procedure to form said first silicon dioxide gate insulator layer, on said first portion of said semiconductor substrate, underlying said composite silicon nitride layer, and simultaneously forming said second silicon dioxide gate insulator layer, on said second portion of said semiconductor substrate, underlying said second silicon nitride layer;

depositing a polysilicon layer; and patterning of said polysilicon layer, said composite silicon nitride layer, and said first silicon dioxide gate insulator layer to form said first group of said gate structures, on said first portion of said semiconductor substrate, and simultaneously patterning of said polysilicon layer, said second silicon nitride layer, and said second silicon dioxide gate insulator layer to from said second group of said gate structures, on said second portion of said semiconductor substrate.

2. The method of claim 1, wherein said first silicon nitride layer is obtained at a thickness between about 5 to 30 Angstroms, using a deposition mode chosen from a group that includes; low pressure chemical vapor deposition, (LPCVD), rapid thermal chemical vapor deposition, (RTCVD), remote plasma enhanced chemical vapor deposition, (RPECVD), or jet vapor deposition, (JVD).

3. The method of claim 1, wherein said second silicon nitride layer is obtained at a thickness between about 5to 30 Angstroms, via a deposition mode chosen from a group that includes; LPCVD, RTCVD, RPECVD, or JVD.

4. The method of claim 1, wherein said oxidation procedure is performed using either a conventional furnace, or a rapid thermal processing, (RTP), system, at a temperature between about 800 to 1100° C., for a time between about 10 to 100 sec., using an ambient chosen from a group that includes; $N_2O$, $NO$, $H_2/O_2$, $H_2O$, or $O_2$.

5. The method of claim 1, wherein said first silicon dioxide gate insulator layer, formed on said first portion of said semiconductor substrate, is obtained using said oxidation procedure, to a thickness between about 3 to 10 Angstroms.

6. The method of claim 1, wherein said second silicon dioxide gate insulator layer, formed on said second portion of said semiconductor substrate, is obtained using said oxidation procedure, to a thickness between about 5 to 20 Angstroms.

7. A method of forming a first silicon dioxide layer on a semiconductor substrate, underlying a composite silicon nitride layer, which is comprised of a second silicon nitride layer and an underlying first silicon nitride layer, while simultaneously forming a second silicon dioxide layer on said semiconductor substrate, underlying said second silicon nitride layer, with said first silicon dioxide layer thinner than said second dioxide layer, comprising the steps of:

depositing said first silicon nitride layer on said semiconductor substrate;

patterning of said first silicon nitride layer, resulting in a portion of said first silicon nitride layer removed from the surface of a second portion of said semiconductor substrate, while another portion of said first silicon nitride remains on a first portion of said semiconductor substrate;

depositing said second silicon nitride layer resulting in said composite silicon nitride layer, overlying said first portion of said semiconductor substrate, and resulting in said second silicon nitride layer located directly overlying said second portion of said semiconductor substrate;

performing a thermal oxidation procedure to form said first silicon dioxide layer, on said first portion of said semiconductor substrate, underlying said composite silicon nitride layer, and simultaneously forming said second silicon dioxide layer, on said second portion of said semiconductor, underlying said second silicon nitride layer;

depositing a conductive layer; and patterning of said conductive layer, of said composite silicon nitride layer, and of said first silicon dioxide layer, to create a first group of gate structure on said first portion of said semiconductor substrate, while simultaneously patterning of said conductive layer, of said second silicon nitride layer, and of said second silicon dioxide layer, to form a second group of gate structures on said second portion of said semiconductor substrate.

8. The method of claim 7, wherein said first silicon nitride layer is obtained at a thickness between about 5 to 30 Angstroms, via a deposition mode chosen from a group that includes; low pressure chemical vapor deposition, (LPCVD), rapid thermal chemical vapor deposition, (RTCVD), remote plasma enhanced chemical vapor deposition, (RPECVD), or jet vapor deposition, (JVD).

9. The method of claim 7, wherein patterning of said first silicon nitride layer is accomplished via a selective RIE procedure, using $CH_2F_2$ as an etchant for said first silicon nitride layer, with an etch rate ratio of silicon nitride to silicon, between about 100 to 1.

10. The method of claim 7, wherein said second silicon nitride layer is obtained at a thickness between about 5 to 30 Angstroms, via a deposition mode chosen from a group that includes; LPCVD, RTCVD, RPECVD, or JVD.

11. The method of claim 7, wherein said thermal oxidation procedure is performed using either a conventional furnace, or a rapid thermal processing, (RTP), system, at a temperature between about 800 to 1100° C., for a time between about 10 to 100 sec. in an ambient chosen from a group that includes; $N_2O$, $NO$, $H_2/O_2$, $H_2O$, or $O_2$.

12. The method of claim 7, wherein said first silicon dioxide layer, formed on said first portion of said semiconductor substrate via said thermal oxidation procedure, is formed at a thickness between about 3 to 10 Angstroms.

13. The method of claim 7, wherein said second silicon dioxide layer, formed on said second portion of said semiconductor substrate via said thermal oxidation procedure, is formed to a thickness between about 5 to 20 Angstroms.

14. The method of claim 7, wherein said conductive layer is a polysilicon layer obtained via LPCVD procedures, to a thickness between about 1500 to 3000 Angstroms, and either doped in situ, during deposition, via the addition of arsine or phosphine to a silane ambient, or deposited intrinsically then doped via implantation of arsenic or phosphorous ions.

* * * * *